(12) United States Patent
Calzolari et al.

(10) Patent No.: US 12,160,258 B2
(45) Date of Patent: Dec. 3, 2024

(54) AVOIDING PING-PONG BETWEEN DIFFERENT ANTENNA TUNING CONFIGURATIONS

(71) Applicant: QUALCOMM Incorporated, San Diego, CA (US)

(72) Inventors: Diego Calzolari, San Diego, CA (US); Guilherme Hoefel, San Diego, CA (US); David Loweth Winslow, San Diego, CA (US); John Boro, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 377 days.

(21) Appl. No.: 17/484,491

(22) Filed: Sep. 24, 2021

(65) Prior Publication Data

US 2023/0099297 A1    Mar. 30, 2023

(51) Int. Cl.
| | | |
|---|---|---|
| *H04B 1/40* | (2015.01) | |
| *G01R 27/26* | (2006.01) | |
| *H01Q 1/24* | (2006.01) | |

(52) U.S. Cl.
CPC .............. *H04B 1/40* (2013.01); *G01R 27/26* (2013.01); *H01Q 1/243* (2013.01)

(58) Field of Classification Search
CPC ...... G01R 27/26; H01Q 1/243; H04B 1/0458; H04B 1/40
See application file for complete search history.

(56) References Cited

U.S. PATENT DOCUMENTS

| | | | | |
|---|---|---|---|---|
| 7,113,087 B1* | 9/2006 | Casebolt | ............... | G06F 1/3215 340/636.11 |
| 11,057,122 B1* | 7/2021 | Bezawada | ............... | G01S 19/07 |
| 2011/0065429 A1* | 3/2011 | Kim | ................. | H04B 1/0458 455/418 |
| 2013/0225171 A1 | 8/2013 | Singh et al. | | |
| 2015/0318625 A1* | 11/2015 | Nakamura | ............. | H01Q 21/28 343/876 |
| 2016/0057260 A1 | 2/2016 | Eremenko et al. | | |
| 2019/0075201 A1* | 3/2019 | Tu | ...................... | H04W 4/026 |
| 2021/0136601 A1* | 5/2021 | Winslow | ............. | G06F 18/2411 |

FOREIGN PATENT DOCUMENTS

EP        2806585 A1    11/2014

OTHER PUBLICATIONS

International Search Report and Written Opinion—PCT/US2022/075269—ISA/EPO—Dec. 13, 2022.

* cited by examiner

*Primary Examiner* — Nguyen T Vo

(74) *Attorney, Agent, or Firm* — Patterson + Sheridan LLP

(57) ABSTRACT

Techniques and apparatus for tuning a wireless data transmission system in an electronic device. One example method includes receiving a measured impedance value corresponding to a current user interaction state with respect to one or more antennas of a mobile device; determining a user interaction stability state of the mobile device based on the measured impedance value and a set of historical impedance values; classifying the current user interaction state based at least on the measured impedance value and a plurality of impedance values from the set of historical impedance values; and tuning the one or more antennas based on the classified current user interaction state and the determined user interaction stability state of the mobile device.

24 Claims, 8 Drawing Sheets

AVOIDING PING-PONG BETWEEN DIFFERENT ANTENNA TUNING CONFIGURATIONS

INTRODUCTION

Aspects of the present disclosure relate to antenna tuning.

Wireless devices, such as smartphones, may have one or more antennas for transmitting and receiving wireless data via a wireless data transmission system. The way in which such devices are used, for example, how a smartphone is being held, can affect the performance of the antennas and thus the performance of the wireless data transmission. Degraded antenna performance may lead to slow wireless data transmission, increased battery usage, and increased wireless network interference, to name just a few issues.

BRIEF SUMMARY

Certain aspects provide a method for adaptively tuning a wireless data transmission system in an electronic device, including receiving a measured impedance value corresponding to a current user interaction state with respect to one or more antennas of a mobile device; determining a user interaction stability state of the mobile device based on the measured impedance value and a set of historical impedance values; classifying the current user interaction state based at least on the measured impedance value and a plurality of impedance values from the set of historical impedance values; and tuning the one or more antennas based on the classified current user interaction state and the determined user interaction stability state of the mobile device.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer-readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain aspects and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1:
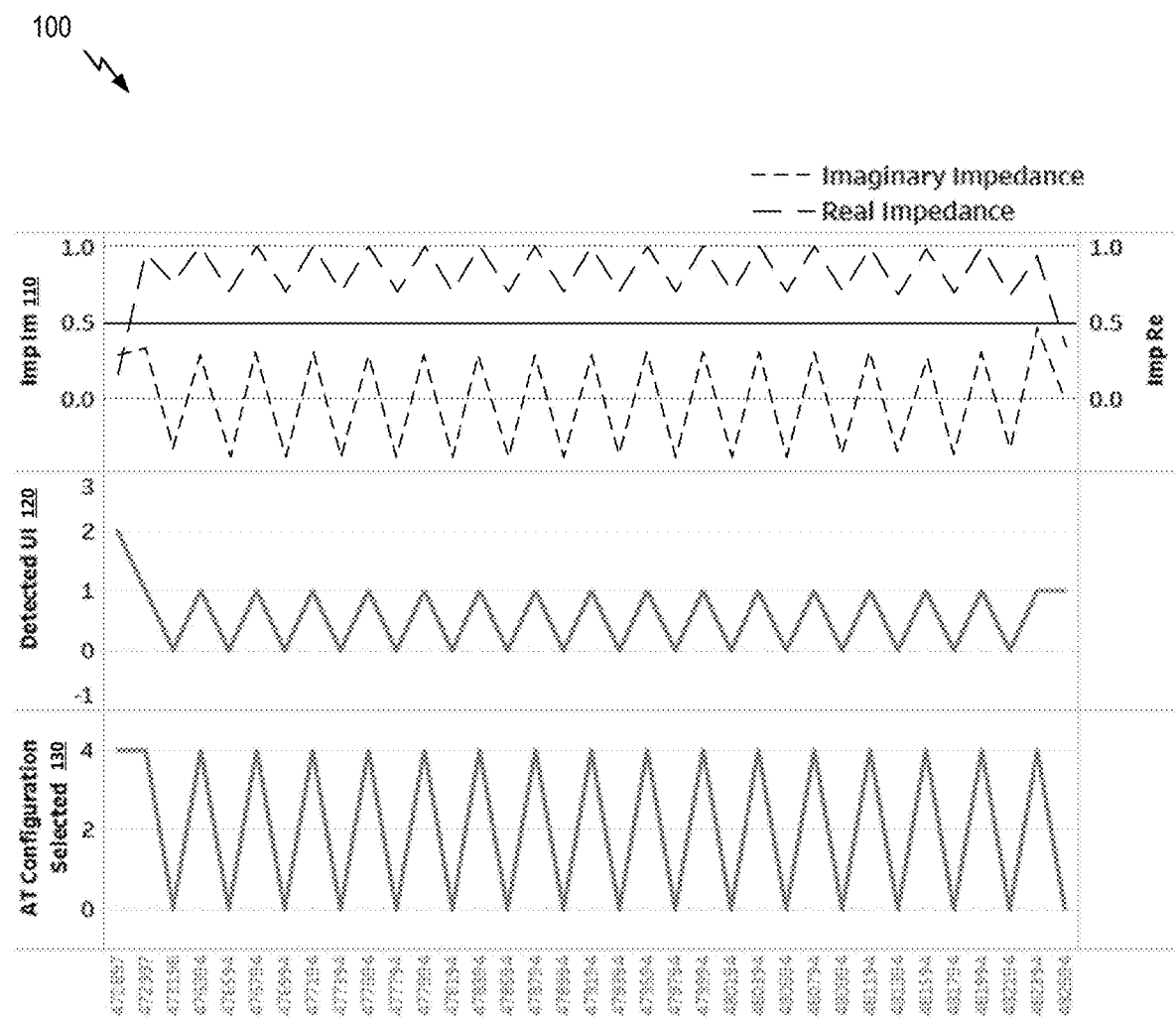
FIG. 1 depicts an example of an antenna tuning configuration ping-pong scenario.

Aspects of the present disclosure provide apparatuses, methods, processing systems, and computer-readable media for avoiding ping-pong between different antenna tuning configurations. Generally, ping-pong may refer to a scenario in which an antenna is repeatedly and rapidly switched between two different antenna tuning configurations.

As wireless electronic devices get smaller and more capable, the challenge of designing wireless data transmission systems gets more complicated, at least in part due to the complexity of designing effective antennas within the tight and complex internal confines of such devices. In fact, because contemporary wireless electronic devices may operate on many wireless frequencies at once for both transmission and reception, multiple antennas of different design are often included in a single device.

The functional design and packaging challenges are only one aspect of the overall challenge of creating effective wireless data transmission systems for wireless electronic devices. The different modes of usage of such devices pose another challenge because different modes affect the performance of the wireless data transmission system(s) differently.

For example, holding a wireless electronic device, such as a smartphone or tablet computer, in a left hand versus a right hand, or with both hands, may change the wireless data transmission performance because the different hand placements affect the various antennas differently. As another example, placement on a surface, placement within a confine (e.g., in a pocket, car, or plane), usage while plugged in (e.g., via a USB or similar cable), and the like, generally affect wireless data transmission performance differently.

Different approaches may be used to improve antenna performance in devices capable of wireless communication. For example, impedance tuning (e.g., for impedance matching) may be performed dynamically to improve the performance of antennas in such devices.

Generally, impedance is the opposition to the flow of energy through a system. Constant electronic signals may have constant impedance, whereas varying electronic signals may have impedance that varies as a function of frequency. Impedance generally has a complex value comprising a resistance component, which forms the "real" part of the value, and a reactance component, which forms the "imaginary" part of the value.

Antenna impedance relates to the voltage and current at a port of an antenna. The real part of the antenna impedance represents power that is either radiated away or absorbed within the antenna, whereas the imaginary part of the antenna impedance may represent power that is stored in the near field of the antenna, i.e., non-radiated power. An antenna is generally more efficient and thus more effective when impedance of the system is optimized for the antenna (e.g., system input and/or output impedance is matched to the antenna impedance).

Impedance matching refers to designing the input impedance of an electrical load or the output impedance of its corresponding signal source to maximize the power transfer and to minimize signal reflection from the load. Because, impedance varies with variable frequency signals, though, dynamic impedance tuning may be used to tune an antenna to match a radio frequency (RF) front-end so that power transfer from the RF front-end to the antenna or vice versa is maximized.

Impedance tuning may be performed in an "open-loop" configuration, where preconfigured parameters are used to tune the antenna to the system, or in a "closed-loop" configuration where parameters are adjusted dynamically to tune the antenna to the system based on a feedback mechanism. In both cases, such parameters may be used to improve antenna performance (e.g., total radiated power and return loss) in a wireless electronic device.

Aperture tuning is another way to improve wireless communication system performance in an electronic device. Generally, antenna aperture tuning involves modifying the resonant frequency of an antenna to match a specific application or frequency. By tuning the resonant frequency of the antenna for a specific application or frequency, the efficiency of the antenna is improved. Aperture tuning may thus allow the same antenna to be used more efficiently for multiple applications at multiple frequencies.

One way to perform antenna aperture tuning is to modify the electrical length of the antenna to adjust its resonant frequency. In some aspects, a switch may be used to adjust the resonant frequency of the antenna by connecting the antenna to ground paths of different lengths, thus shifting the antenna's resonance and thereby changing the performance of the antenna without any structural change to the antenna. A capacitor or inductor can also be used to further adjust the resonant frequency and can generally be connected between a switch and a radiating element of an antenna.

Aperture tuning and impedance tuning may generally improve an antenna's performance, such as its band of operation, return loss, bandwidth, gain, and efficiency. In contemporary mobile devices, such as smartphones, tablet computers, smart wearables, and the like, aperture tuning may beneficially improve the device's ability to operate in multiple bands at different times in what may be referred to as "band-select tuning."

Aspects described herein relate to systems and methods for performing antenna tuning in mobile devices. Generally, antenna tuning may refer to one or more of impedance matching, aperture tuning, or other actions that can be performed to adjust the electrical characteristics of an antenna. Unlike some methods in which antenna tuning configurations are selected based on the current classification of detected user interaction with a mobile device and the antennas disposed thereon, the techniques described herein relate to using historical and current user interaction classifications to tune one or more antennas in a mobile device. Using historical and current user interaction classifications can allow for the detection of an unstable user interaction state over time. When a mobile device is in an unstable user interaction state, changes to antenna tuning configurations can be minimized, or at least reduced, so that antenna tuning configurations are not repeatedly and rapidly changed while the mobile device is in the unstable user interaction state. Thus, aspects described herein may minimize, or at least reduce, a number of times antenna tuning configurations are changed during operation of a wireless device, which may reduce the device's sensitivity to various external factors, improve the reliability of wireless communications, and reduce power consumption involved in tuning antennas in wireless communication systems.

Beneficially, aspects described herein generally improve antenna performance in mobile devices with wireless communication systems, increase transmission and reception range of such devices, increase battery life of battery-operated devices, and decrease interference in wireless data communication networks used by such devices.

Example Antenna Aperture Tuning

Conventional antenna tuning generally attempts to transmit signaling at a maximum transmit power. To do so, classification models can be used to classify a current user interaction into one of a plurality of user interaction categories (e.g., right-handed holding of a device, left-handed holding of a device, device stationary and not in contact with a human body, device located in a pocket, etc.). Based on the classified user interaction, an antenna tuning configuration, such as an impedance configuration and/or an antenna aperture configuration, can be selected so that a wireless device transmits signals using the maximum transmit power, or at least a transmit power close to the maximum transmit power.

In some operating scenarios, antenna tuning based on current user interaction classification may result in a mobile device, such as a user equipment (UE), entering an antenna tuning configuration ping-pong scenario. In an antenna tuning configuration ping-pong scenario, the antenna tuning configuration may repeatedly and rapidly change back and forth between different configurations associated with different user interaction classifications. Because the antenna tuning configuration may repeatedly and rapidly change, communications may not actually be transmitted at the expected maximum transmit power, and power may be needlessly expended in repeatedly changing the antenna tuning configuration. One operating scenario in which a UE can enter an antenna tuning configuration ping-pong scenario may include a scenario in which a measured impedance load caused by user interaction is close to a decision boundary between two different antenna tuning configuration states. In this operating scenario, small changes in the measured impedance may cause the antenna tuning configuration to repeatedly change from a first state to a second state and back. In another operating scenario, a mobile device may classify the user interaction into an incorrect state (e.g., classify the user interaction into State B' instead of State B, which may be a more accurate representation of the user interaction). Because of this misclassification and corresponding degradation in antenna performance, the mobile device may re-select a previous antenna tuning configuration (e.g., an antenna tuning configuration associated with State A), and thus enter a loop in which the antenna tuning configuration repeatedly changes between an antenna tuning configuration associated with State A and an antenna tuning configuration associated with State B'.

FIG. 1 illustrates an example timing diagram 100 of an antenna tuning configuration ping-pong scenario for a mobile device over a given time period. As illustrated, the timing diagram 100 illustrates an impedance measurement timeline 110, detected user interaction timeline 120, and selected antenna tuning configuration timeline 130, with the numbers along the horizontal axis in each of timelines 110, 120, and 130 representing different timestamps (or different sample numbers). In the timing diagram 100, the mobile device may have a blocked antenna for a given duration of time (e.g., 30 seconds), during which the mobile device may be in an antenna tuning configuration ping-pong state.

As illustrated in the timing diagram 100, the mobile device may have an initial antenna tuning configuration at timestamp 472897 of AT 4 in a set of antenna tuning configurations {AT 0, AT 1, AT 2, AT 3, AT 4}. It should be recognized that the set of antenna tuning configurations is solely for illustrative purposes, and that a mobile device may have any number of antenna tuning configurations from which one antenna tuning configuration may be selected. The initial antenna tuning configuration may correspond to a detected user interaction designated as UI 2, as illustrated in the detected user interaction timeline 120.

At timestamp 473198, it may be seen in the impedance measurement timeline 110 that the impedance has changed. A corresponding detected user interaction of UI 0 may be generated from the impedance measurement, and the antenna tuning configuration may thus switch from AT 4 to AT 0. From timestamp 473198, it may be seen in the impedance measurement timeline 110 that the measured impedance at the mobile device oscillates between a high value and a low value for each of the real and imaginary values. The corresponding user interaction classification illustrated in the detected user interaction timeline 120 may similarly oscillate between a detected user interaction of UI 1 and UI 0. Similarly, the antenna tuning configuration selected for the mobile device may oscillate between AT 4 and AT 0, as illustrated in the selected antenna tuning configuration timeline 130.

Figure 2:
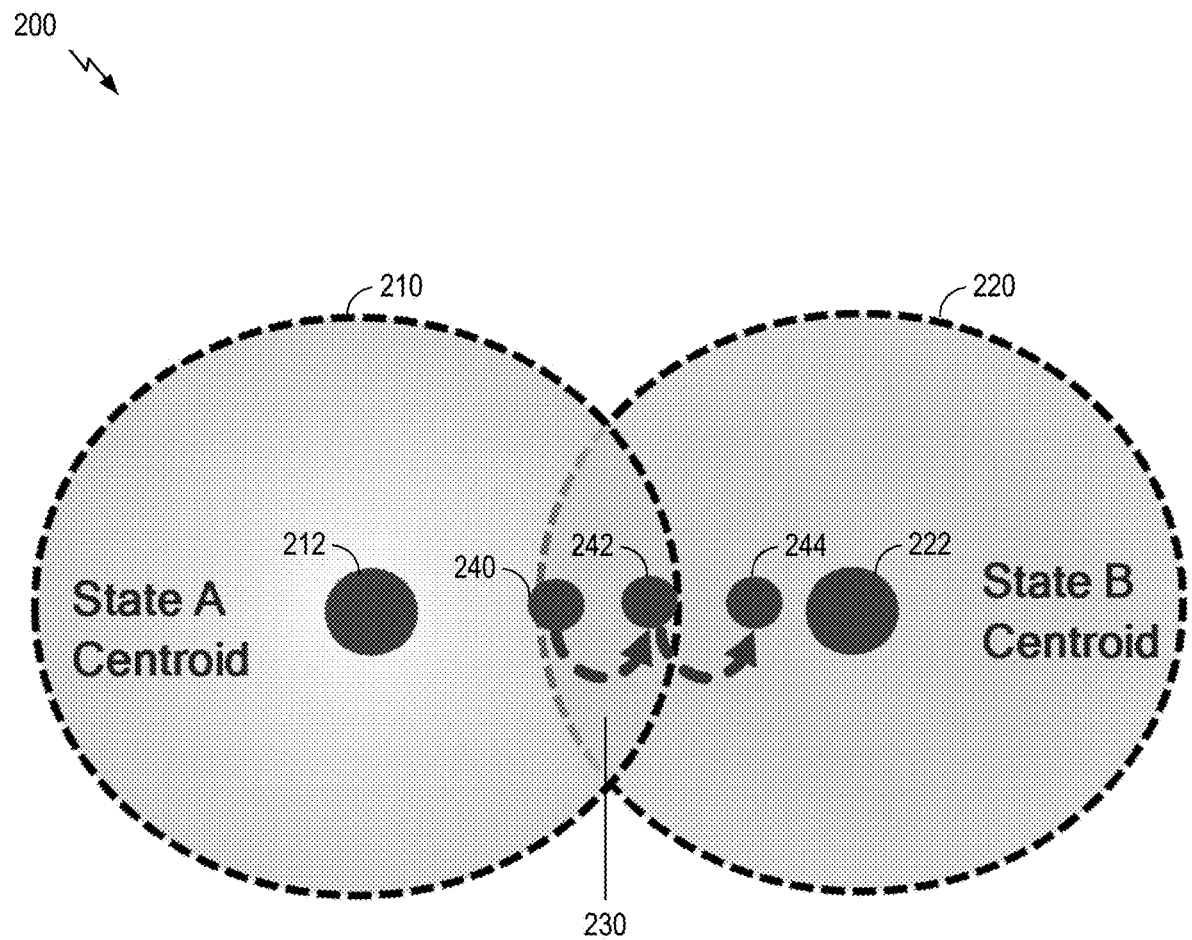
FIG. 2 depicts an example technique for avoiding an antenna tuning configuration ping-pong scenario.

Various techniques have been proposed to reduce the likelihood that a mobile device will enter such an antenna tuning configuration ping-pong state. FIG. 2 illustrates on example approach for antenna tuning configuration that can reduce the likelihood that a mobile device will enter an antenna tuning configuration ping-pong state. In this example, a first state cluster 210 and a second state cluster 220 may be defined, with an overlapping area 230 between the first state cluster 210 and the second state cluster 220. The first state cluster 210 may be associated with a centroid 212 which is associated with a first antenna tuning configuration, and the second state cluster 220 may be associated with a centroid 222 which is associated with a second antenna tuning configuration.

To determine the user interaction state from a given impedance measurement, it may be determined whether an impedance measurement is located within the boundaries of any given state cluster. A "greedy" approach may be used to prioritize selection of a current user interaction state (corresponding to one of the state clusters 210, 220) until the impedance measurement, and classified user interaction state, crosses outside of the boundary of the state cluster associated with the current user interaction state. As illustrated in FIG. 2, suppose that the current user interaction state corresponds to State A (i.e., is within state cluster 210), and a first impedance measurement is taken that corresponds to value 240. In this case, value 240 is located within the overlapping area 230; thus, it is possible for value 240 to result in the selection of an antenna tuning configuration associated with the first state cluster 210 or the second state cluster 220. Using a "greedy" approach, where the mobile device is configured to prioritize using the current antenna tuning configuration over a new and different configuration, the mobile device may determine that because value 240 is located within state cluster 210 and because the mobile device is currently using an antenna tuning configuration associated with state cluster 210, the mobile device should continue to use the antenna tuning configuration associated with state cluster 210. This approach may continue with value 242, which is also located within the overlapping area 230 (though closer to the boundary of state cluster 210). Because value 242 is still located within state cluster 210, the mobile device can continue to use the antenna tuning configuration associated with state cluster 210.

Value 244, however, is located outside of overlapping area 230. Because value 244 is located outside of overlapping area 230, the mobile device can determine that the antenna tuning configuration should change from an antenna state associated with state cluster 210 to the antenna state associated with the state cluster in which value 244 is located (in this illustration, to the antenna state associated with state cluster 220).

The hysteresis techniques illustrated in FIG. 2 may address some situations in which a mobile device may enter an antenna tuning configuration ping-pong scenario. For example, the techniques illustrated in FIG. 2 may reduce the likelihood of entering an antenna tuning configuration ping-pong scenario when impedance or other measurements are close to a decision boundary between different antenna states. However, the techniques illustrated in FIG. 2 may not address other situations in which a mobile device may enter an antenna tuning configuration ping-pong scenario, such as when an impedance or other measurement results in the selection of an incorrect antenna tuning configuration and a reversion to a previous antenna tuning configuration.

Example System for Performing Adaptive Antenna Tuning

Figure 3:
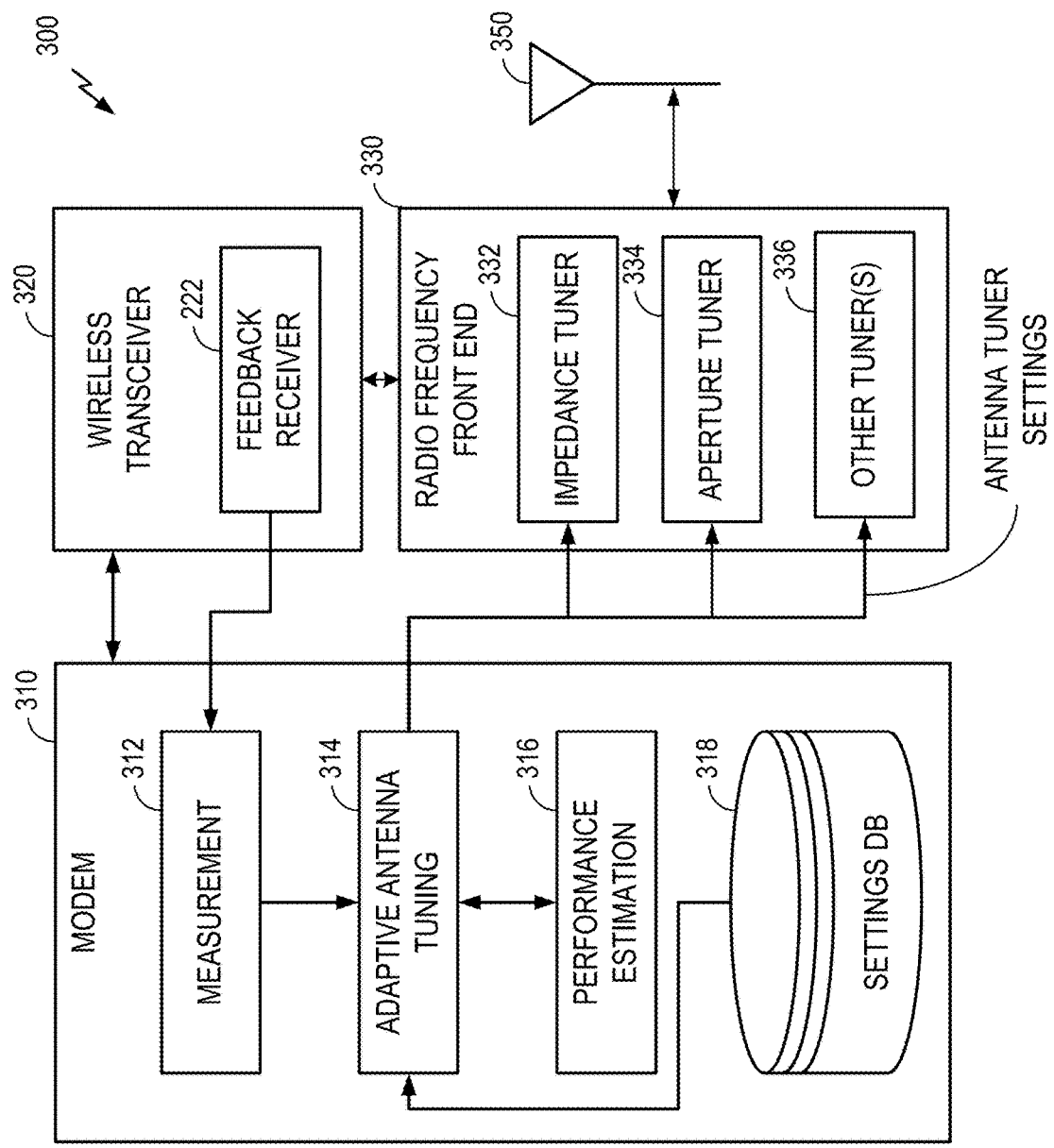
FIG. 3 depicts an example system for performing adaptive antenna tuning in a wireless electronic device.

FIG. 3 depicts an example system 300 for performing adaptive antenna tuning in a wireless electronic device.

System 300 includes a modem 310, which in this example includes a measurement component 312, adaptive antenna tuning component 314, performance estimation component 316, and antenna tuner settings database 318.

Measurement component 312 may be configured to receive measurement data, such as impedance and frequency measurements, from other aspects of a wireless electronic device. For example, measurement component 312 may receive measurements from a feedback receiver (FBRx) 322 of a wireless transceiver 320 in one aspect. Generally, feedback receiver 322 is a circuit that compares a measurement of a transmitted signal at different points along the transmission chain. For example, a voltage standing wave ratio (VSWR) or return loss may be determined, which provides a measurement of complex impedance of the transmit signal. Then, an aspect of modem 310, such as adaptive antenna tuning component 314, may translate the complex impedance to impedance at the antenna. As above, this antenna impedance may be used to determine how the antenna is affected by different antenna tuner settings, such as an impedance tuner setting, an aperture tuner setting, and/or other tuner settings implemented by impedance tuner 332, aperture tuner 334, and/or other tuner(s) 336, respectively.

Adaptive antenna tuning component 314 may implement an agent for determining antenna tuner settings, including settings for impedance tuner 332 and/or aperture tuner 334, as described further with respect to FIG. 3. In some cases, the agent may determine and/or select from settings stored in antenna tuner settings database 318. The settings may include aperture, impedance, and/or other tuner settings that can be implemented by impedance tuner 332, aperture tuner, 334, and/or other tuner(s) 336, and which may be considered aspects of a state of radio frequency front end (RFFE) 330 when implemented. For example, a state of radio frequency front end 330 may be defined by the setting of impedance tuner 332, aperture tuner, 334, and/or other tuner(s) 336.

In this example, radio frequency front end 330 includes an impedance tuner 332 and an aperture tuner 334, which are configured to perform impedance tuning and aperture tuning, respectively. Radio frequency front end 330 further includes other tuner(s) 336, which may include, for example, one or more matching networks for matching a power amplifier's output an antenna to improve power amplifier performance.

Note that radio frequency front end 330 may include many other aspects that are not depicted in this example for simplicity, such as power amplifiers, power trackers, duplexers, hexaplexers, switches, low noise amplifiers, filters, antenna switches, and extractors, to name a few.

Radio frequency front end 330 is further coupled to antenna 350 (e.g., via a radio frequency switch and/or a diplexer or duplexer). Note that in this example, a single antenna 350 is depicted for simplicity, but radio frequency front end 330 may be connected to a plurality of antennas. Further, this example depicts a single radio frequency front end, but other examples may include multiple radio frequency front ends, such as for different radio access technologies, and for operating on different frequencies simultaneously.

Adaptive antenna tuning component 314 is further configured to provide the antenna tuner settings to impedance tuner 332, aperture tuner 334, and/or other tuner(s) 336 in radio frequency front end 330 in order to improve the performance of antenna 350 (which may be representative of multiple antennas). Adaptive antenna tuning component 314 can significantly improve the performance of the electronic device's wireless data transmission system(s). For example, a 3-5 dB improvement in antenna efficiency may be achieved along with reduced power usage, increased battery life, and decreased network interference. Such improvements, while generally beneficial, may be particularly relevant to certain scenarios, such as usage indoor and/or at a cell edge, or when a device is handled in such a way that multiple antennas are covered.

In order to transmit and receive data, modem 310 is connected to wireless transceiver 320, which is in turn connected to the radio frequency front end 330, which is connected to antenna 350. Note that modem 310 may include many other aspects that are not depicted in this example for simplicity, such as processing cores, read-only memories (ROMs), random access memories (RAMs), security components, peripheral components, caches, and others.

Notably, FIG. 3 depicts only selected aspects of a device's wireless data transmission system for simplicity, and many other aspects are possible, such as other processors, memories, sensors, input and output devices, peripheral systems, and the like.

Example Anti-Ping-Pong Antenna Tuning

To further minimize, or at least reduce, a likelihood of encountering an antenna tuning configuration ping-pong scenario, aspects of the present disclosure use current and historical impedance measurements to determine when the antenna tuning configuration for a mobile device can be changed. According to aspects of the present disclosure, a "distance" between consecutive measurements, a "speed" over which measurements change, and historical information can be used to determine when the antenna tuning configuration for a device can be changed and the antenna tuning configuration to use in changing the antenna tuning configuration. As discussed in further detail herein, current and historical impedance measurements can be used to determine whether a mobile device is in an unstable state or in a stable state. Generally, an unstable state may correspond to scenarios in which a user interaction is transitioning from a first state to a second state (e.g., transitioning from being held in one hand to held in the other hand, transitioning from being held by a user to being placed on a table or other surface in which user interaction with the mobile device may be negligible, etc.). When the mobile device exits an unstable state, a user interaction state of the mobile device can be determined (e.g., based on a machine learning model trained to classify an impedance value into one of a plurality of user interaction states associated with one of a plurality of antenna tuning configurations). By remaining in the current antenna tuning configuration until a transition from one user interaction state to another user interaction state is completed, the likelihood that a mobile device will encounter an antenna tuning configuration ping-pong scenario in which the antenna configuration repeatedly changes back and forth during a transition between different user interaction states may be significantly reduced.

Figure 4:
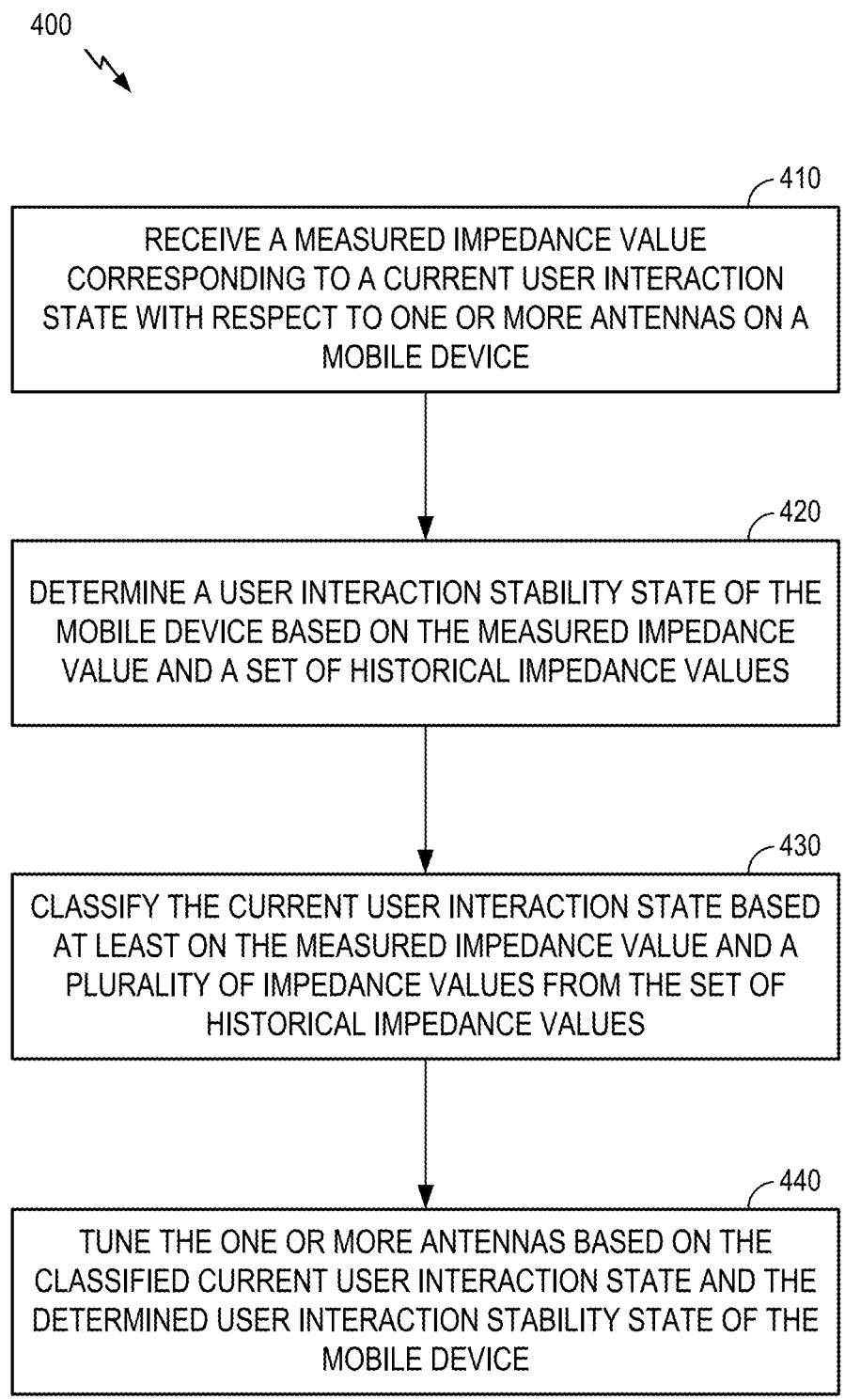
FIG. 4 illustrates an example method for selecting antenna tuning configurations based on current and historical impedance measurements, in accordance with certain aspects of the present disclosure.

FIG. 4 illustrates example operations 400 that may be performed by a mobile device for selecting antenna tuning configurations based on current and historical impedance measurements to avoid an antenna tuning configuration ping-pong scenario, in accordance with certain aspects of the present disclosure. Operations 400 may be performed, for example, by system 300 illustrated in FIG. 3 or processing system 800 illustrated in FIG. 8.

As illustrated, operations 400 may begin at block 410, where a measured impedance value is received. Generally, the measured impedance value may correspond to a current user interaction state with respect to one or more antennas of a mobile device.

At block 420, a user interaction stability state of the mobile device may be determined based on the measured impedance value and a set of historical impedance values. In some aspects, the set of historical impedance values may correspond to impedance values measured or otherwise obtained over a moving time window. This time window may correspond, for example, to an amount of time prior to the current time. Generally, the time window may be sized such that the number of impedance value measurements included in the set of historical impedance values includes a sufficient number of measurements for determining that the mobile device is in an unstable user interaction state.

In some aspects, the user interaction stability state may be determined based on a determination that the mobile device has reached a steady state different from a state associated with a last stable measured impedance value. In this example, the mobile device can determine that a change in impedance between consecutive measurements in the set of historical impedance values exceeds a threshold value (corresponding to a "distance" gating mechanism used to determine whether the device is in a stable state for tuning the antennas of the mobile device), thus indicating that the mobile device was previously in an unstable state. This threshold value may be statically defined or dynamically configured. For example, the threshold value may be determined based on an amount of variability between the plurality of impedance values in the set of historical impedance values. By determining the threshold value based on an amount of variability between the plurality of impedance values, the threshold value can be dynamically changed so that convergence can be quickly identified after a spike in impedance values corresponding to a change in user interaction state (corresponding to a "speed" gating mechanism used to determine whether the device is in a stable state for tuning the antennas of the mobile device).

Subsequently, the mobile device can detect a convergence on a value from the set of historical impedance values and the measured impedance value. For example, such a convergence may be determined based on a most recent number n of values in the set of historical impedance values and the measured impedance value, and convergence may be defined as a consecutive number of measured impedance values that are sufficiently similar to each other. Sufficient similarity may be defined, for example, based on a moving average of impedance values, based on a difference between a minimum and maximum impedance value over the most recent number n of values in the set of historical impedance values and the measured impedance value, or the like. If the mobile device determines that the impedance values have converged, the mobile device can determine that it has reached a steady state different from the state associated with the last stable measured impedance value.

In some aspects, the user interaction stability state may be determined based on a moving average of impedance values in the set of historical impedance values. When the mobile device determines that the measured impedance is more than a threshold amount away from the moving average, the mobile device can determine that the current user interaction state is different from a previous user interaction state, and thus that a transition is occurring between a first user interaction state and a second user interaction state. Subsequently, the mobile device can detect a convergence on a value from the set of historical impedance values and the measured impedance value. Based on detecting this convergence, the mobile device can then determine that it has reached a steady state different from the state associated with the last stable measured impedance value.

In some aspects, to determine the user interaction stability state of the mobile device, the mobile device can determine that the mobile device has reached a stable state different from a state associated with a last stable measured impedance value. To do so, each of a plurality of impedance values from the set of historical impedance values may be classified (e.g., using one or more machine learning models trained to classify impedance values into one of a plurality of user interaction states). The mobile device can then identify matches between the classified current user interaction state and the classifications of each of the plurality of impedance values. If a threshold number of matches are found between the classified current user interaction state and the classifications of each of the plurality of impedance values, the mobile device can determine that the mobile device has reached a stable state. Otherwise, the mobile device can determine that it is in an unstable state and can defer re-tuning of the antennas until such time as the mobile device does reach a stable state.

At block 430, the current user interaction state is classified based at least on the measured impedance value and a plurality of impedance values from the set of historical impedance values.

At block 440, the one or more antennas of the mobile device are tuned based on the classified current user interaction state and the determined user interaction stability state of the mobile device. Generally, a change in antenna tuning configuration used by the mobile device may be performed when the mobile device exits to a user interaction stability state corresponding to stable user interaction from a user interaction stability state corresponding to unstable user interaction with the mobile device. As discussed, by tuning the antennas after a transition from an unstable user interaction state to a stable user interaction state, repeated tuning and re-tuning of the antennas of the mobile device that may occur during a transitioning state may be avoided.

In some aspects, tuning the one or more antennas may include tuning the one or more antennas to an antenna tuning configuration associated with a classification of the current user interaction state. The antenna tuning configuration may include, for example, an antenna aperture configuration, an impedance tuning configuration, or other configuration that may change the properties of the antenna (e.g., electrical length, maximum transmit power, etc.).

Figure 5:
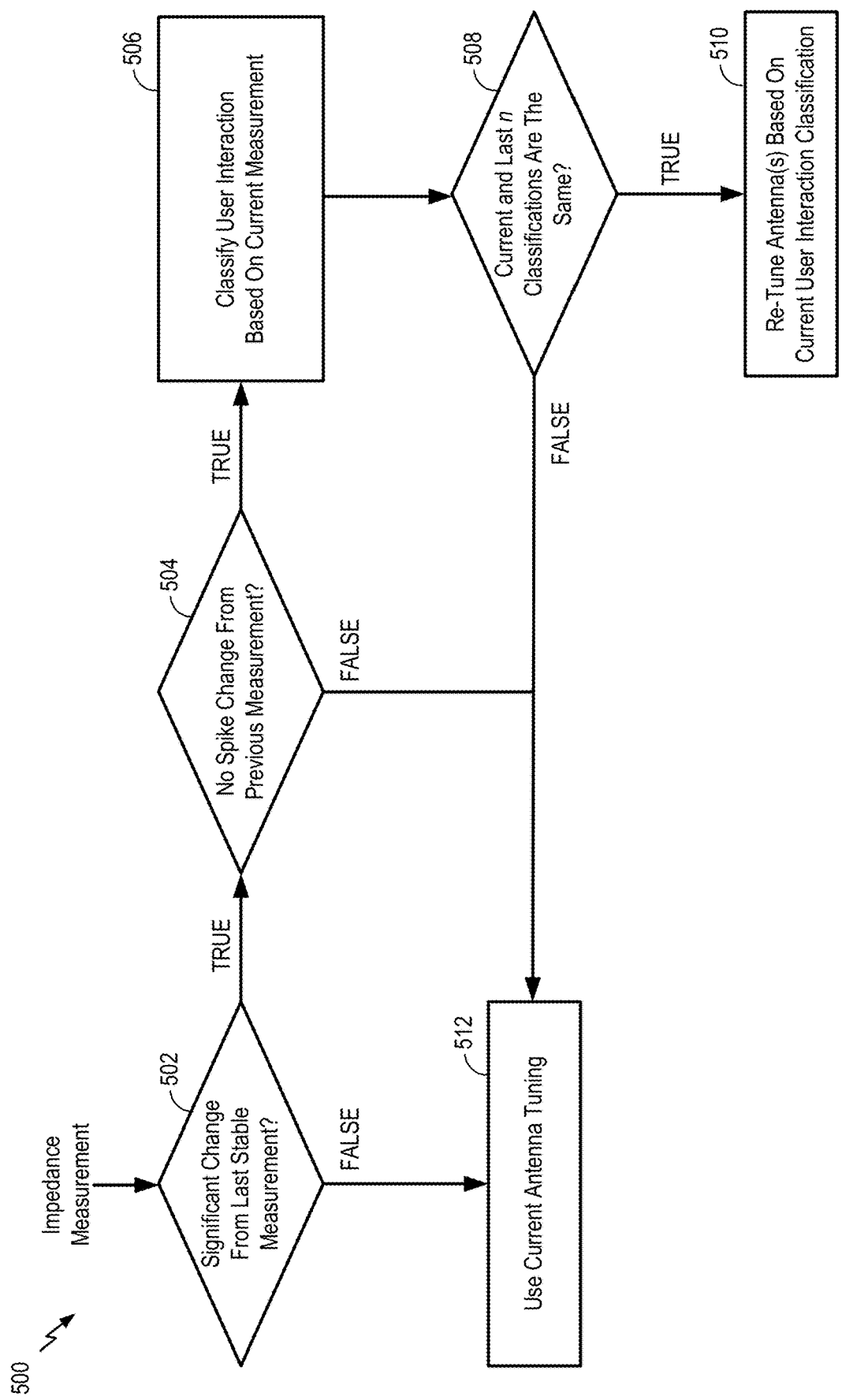
FIG. 5 depicts an example process flow diagram for performing antenna tuning while avoiding an antenna tuning configuration ping-pong scenario, in accordance with certain aspects of the present disclosure.

FIG. 5 illustrates an example process flow diagram for performing antenna tuning while avoiding an antenna tuning configuration ping-pong scenario, in accordance with certain aspects of the present disclosure.

As illustrated, a measured impedance value can be received as input into an antenna tuning process 500. The measured impedance value may correspond to the current impedance measurement for one or more antennas of a mobile device.

At block 502, it is determined whether the measured impedance value corresponds to a significant change from a last stable measurement. Generally, a significant change between the last stable measurement and the measured impedance value may correspond to a change that exceeds a threshold value, which may be statically defined or dynamically determined based on historical impedance values that were previously measured by the mobile device. If the measured impedance value is determined to not correspond to a significant change from the last stable measurement, then antenna tuning process 500 may proceed to block 512, where the mobile device uses the current antenna tuning (i.e., no change is made to the antenna tuning configuration used by the mobile device) at block 512.

Otherwise, process 500 proceeds to block 504, where it is determined whether the measured impedance value corresponds to a spike change relative to the previous measurement. Generally, a spike change relative to a previous measurement may correspond to a change between the current and the previous measurements that exceeds a threshold value. A spike change from the last measurement may indicate that the mobile device is transitioning from one user interaction state to another, while a lack of a spike change from the last measurement may indicate that the mobile device has reached a steady state different from a state associated with the last stable measurement. If, at block 504, the mobile device determines that there has been a spike change between the current and previous measurements, process 500 may proceed to block 512, where the mobile device uses the current antenna tuning.

Otherwise, process 500 proceeds to block 506, where user interaction is classified based on the measured impedance value received as input into process 500. The classification of user interaction may be generated using any of various suitable techniques, such as with a look-up table or one or more classification machine learning models configured to classify the measured impedance value into one of a plurality of user interaction classifications. These machine learning models may include, for example, clustering algorithms or other machine learning models trained using unsupervised learning techniques that may allow for the classification of data into one of a plurality of clusters corresponding to one of a plurality of classifications. In some aspects, these machine learning models may include machine learning models trained using supervised learning techniques that assigns a user interaction label to the measured impedance value.

At block 508, the current and the most recent n user interaction classifications are compared, where n is a positive integer. If, at block 508, it is determined that the current and the most recent n classifications are the same, it may be determined that the mobile device has entered a stable state. Process 500 may proceed to block 510, where the mobile device re-tunes the antenna(s) to an antenna tuning configuration associated with the current user interaction classification. Otherwise, the mobile device may be determined to still be in an unstable state, and process 500 may proceed to block 512, where the mobile device continues to use the current antenna tuning.

Figure 6:
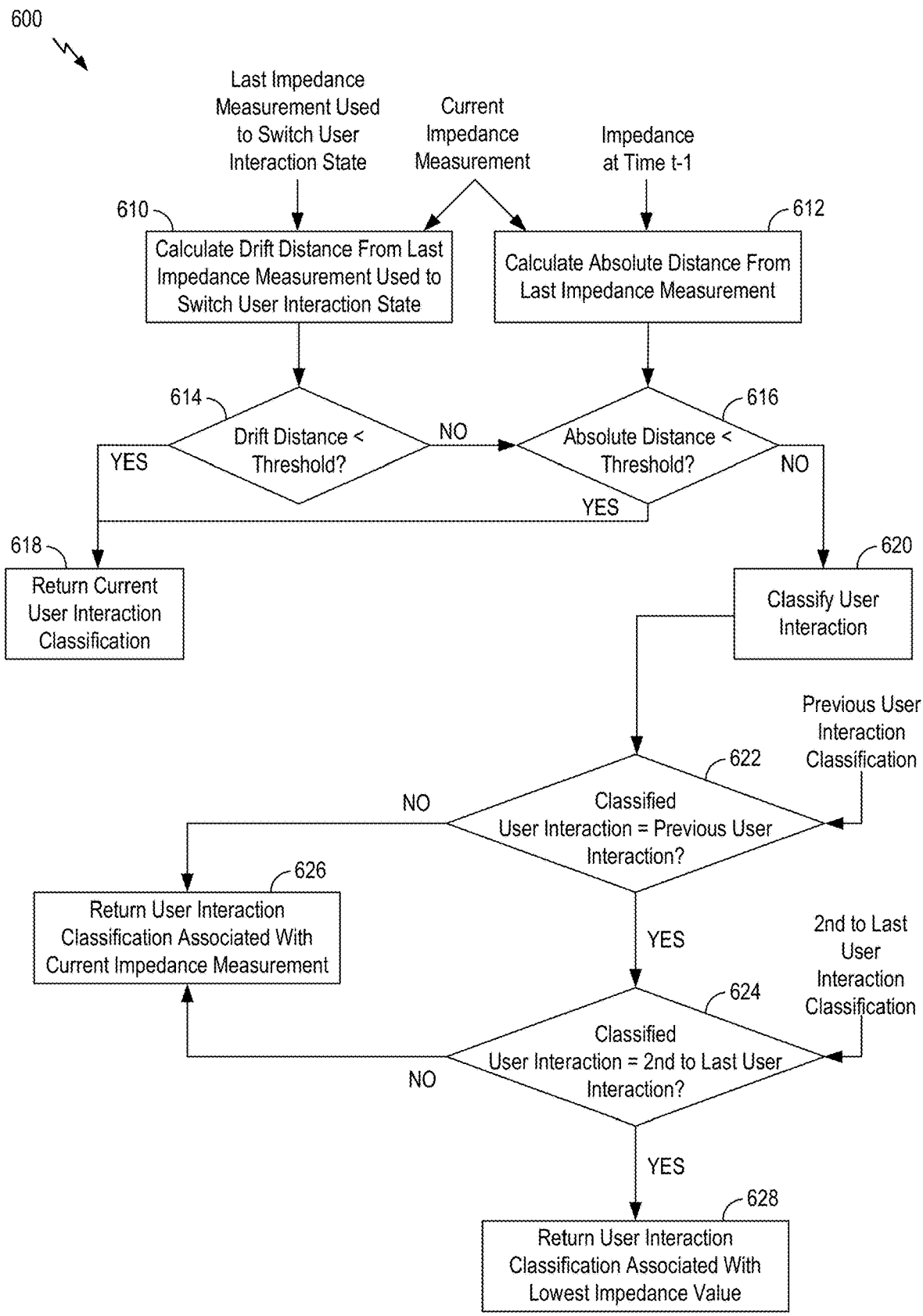
FIG. 6 is a flow chart for selecting antenna tuning configurations based on current and historical impedance measurements, in accordance with certain aspects of the present disclosure.

FIG. 6 illustrates a flow chart for selecting user interaction classifications for antenna tuning configurations based on current and historical impedance measurements, in accordance with certain aspects of the present disclosure. As illustrated, a process 600 for selecting user interaction classifications for antenna tuning configurations based on current and historical impedance measurements may begin at blocks 610 and 612, which may be performed substantially in parallel. At block 610, a drift distance between a current impedance measurement and a last impedance measurement used to switch user interaction states is calculated. Similarly, at block 612, an absolute difference between the current impedance measurement and the last impedance measurement is calculated.

At block 614 and block 616, the calculated drift distance and the calculated absolute distance, respectively, is compared to a threshold value. The threshold value may be defined differently for the drift distance between the current impedance measurement and a last impedance measurement used to switch user interaction states and for the absolute difference between the current impedance measurement and the last impedance measurement.

If, at block 614, the calculated drift distance is determined to be less than the threshold value or if, at block 616, the calculated absolute distance is determined to be less than the threshold value, a mobile device can determine that the device is in a stable state and can proceed to block 618, where the current user interaction classification used to determine the current antenna tuning configuration is returned as the output of process 600.

If, however, at block 614, the calculated drift distance is determined to exceed the threshold value and if, at block 616, the calculated absolute distance is determined to exceed the threshold value, process 600 may proceed to block 620, where the current impedance measurement is classified into one of a plurality of user interaction classifications. As discussed, these user interaction classifications may correspond to various user interaction states such as a mobile device being held in the user's right hand, a mobile device being held in the user's left hand, the mobile device being stored away from the user's body, the mobile device being stored in a pocket with some contact with the user's body, the mobile device being placed on a surface, or the like.

At block 622, it is determined whether the classified user interaction is the same as a previous user interaction classification. If the classified user interaction different from previous user interaction classification, then process 600 may proceed to block 626, where the user interaction classification associated with the current impedance measurement is returned as the output of process 600. Otherwise, process 600 may proceed to block 624, where it is determined whether the classified user interaction is the same as the second to last user interaction classification.

If, at block 624, it is determined that the classified user interaction is different from the second to last user interaction classification, it may be determined that the mobile device is in a stable state and that the current user interaction classification can be used to select an antenna tuning configuration for the mobile device. Thus, process 600 can proceed to block 626, discussed above. Otherwise, the mobile device may be in an unstable state. Thus, process 600 can proceed to block 628, where the returned user interaction classification is selected as the classification associated with the lowest impedance value among the impedance value associated with the second to last user interaction classification, the last impedance measurement used to switch user interaction states, and the current impedance value. It should be understood, however, that other quality metrics can be used to select the user interface classification in a situation where there is instability across a plurality of user interaction classifications. For example, the quality metric may be an antenna efficiency, or some other quality metric that can be used to select a user classification with a better quality metric (e.g., higher antenna efficiency) for use in determining an antenna tuning configuration to use while the mobile device is in an unstable state.

Figure 7:
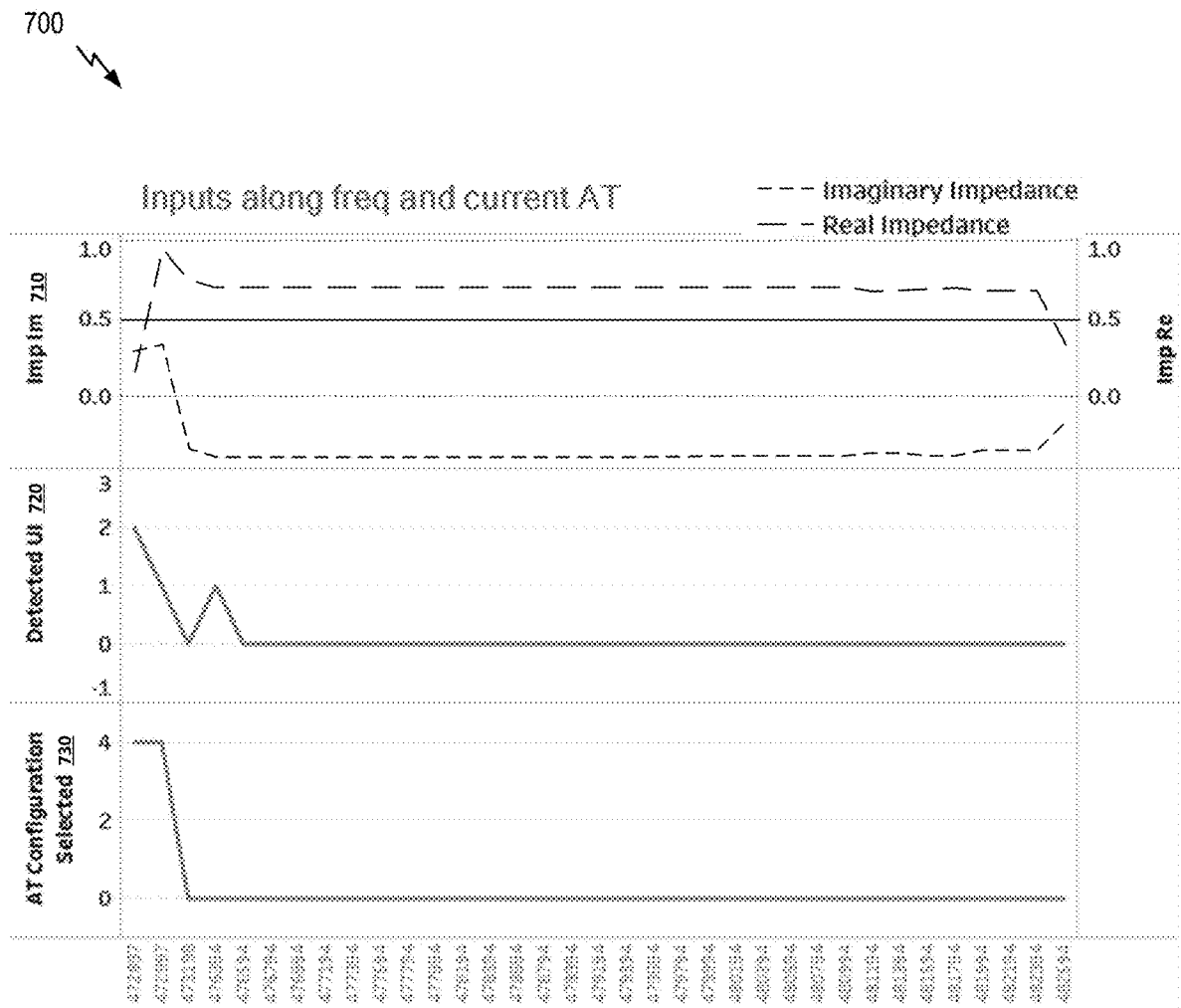
FIG. 7 illustrates an example of an antenna tuning configuration selected using techniques that avoid an antenna tuning configuration ping-pong scenario, in accordance with certain aspects of the present disclosure.

FIG. 7 is an example timing diagram 700 of an antenna tuning configuration selected using techniques that avoid an antenna tuning configuration ping-pong scenario, in accordance with certain aspects of the present disclosure. As illustrated, the timing diagram 700 includes an impedance measurement timeline 710, detected user interaction timeline 720, and selected antenna tuning configuration timeline 730. For the timing diagram 700, the mobile device may have a blocked antenna for a given duration of time (e.g., 30 seconds), during which the mobile device may be susceptible to entering an antenna tuning configuration ping-pong state when other antenna tuning techniques are used.

As illustrated, the timing diagram 700 may commence with a user interaction classification of UI 2 and a selected antenna tuning configuration of AT 4, as illustrated at timestamp 472897 in detected user interaction timeline 720 and selected antenna tuning configuration timeline 730, respectively. At timestamp 473198, a change in impedance is detected that exceeds a threshold level, as shown in impedance measurement timeline 710. A corresponding change to the classified user interaction may be seen at that timestamp, with the classified user interaction switching from UI 2 to UI 0. Based on this change to the classified user interaction, the antenna tuning configuration may switch from AT 4 to AT 0.

Subsequently, some instability may be detected between consecutive impedance measurements, as illustrated at timestamps 472997, 473198, and 476394 in impedance measurement timeline 710. Because instability is detected in these impedance measurements, the antenna tuning techniques described herein may continue to use the most recent user interaction classification and antenna tuning configuration selection, thus avoiding an antenna configuration tuning ping-pong scenario.

When, at timestamp 476594, it is determined that the impedance measurements have become stable, the impedance measurement may be classified into one of a plurality of user interaction states. In this case, the user interaction may be classified as UI 1. However, because, over a short window of time, a transition to multiple user interaction states has been detected (i.e., a transition from UI 2 to UI 0, and then shortly thereafter a transition from UI 0 to UI 1), a fallback technique can be used to tune the antennas to the configuration associated with the smallest impedance value. Thus, as illustrated in the timing diagram 700, the antennas of a mobile device can remain tuned using antenna tuning configuration AT 0, until some later point in time.

Example Electronic Device for Performing Antenna Tuning

Figure 8:
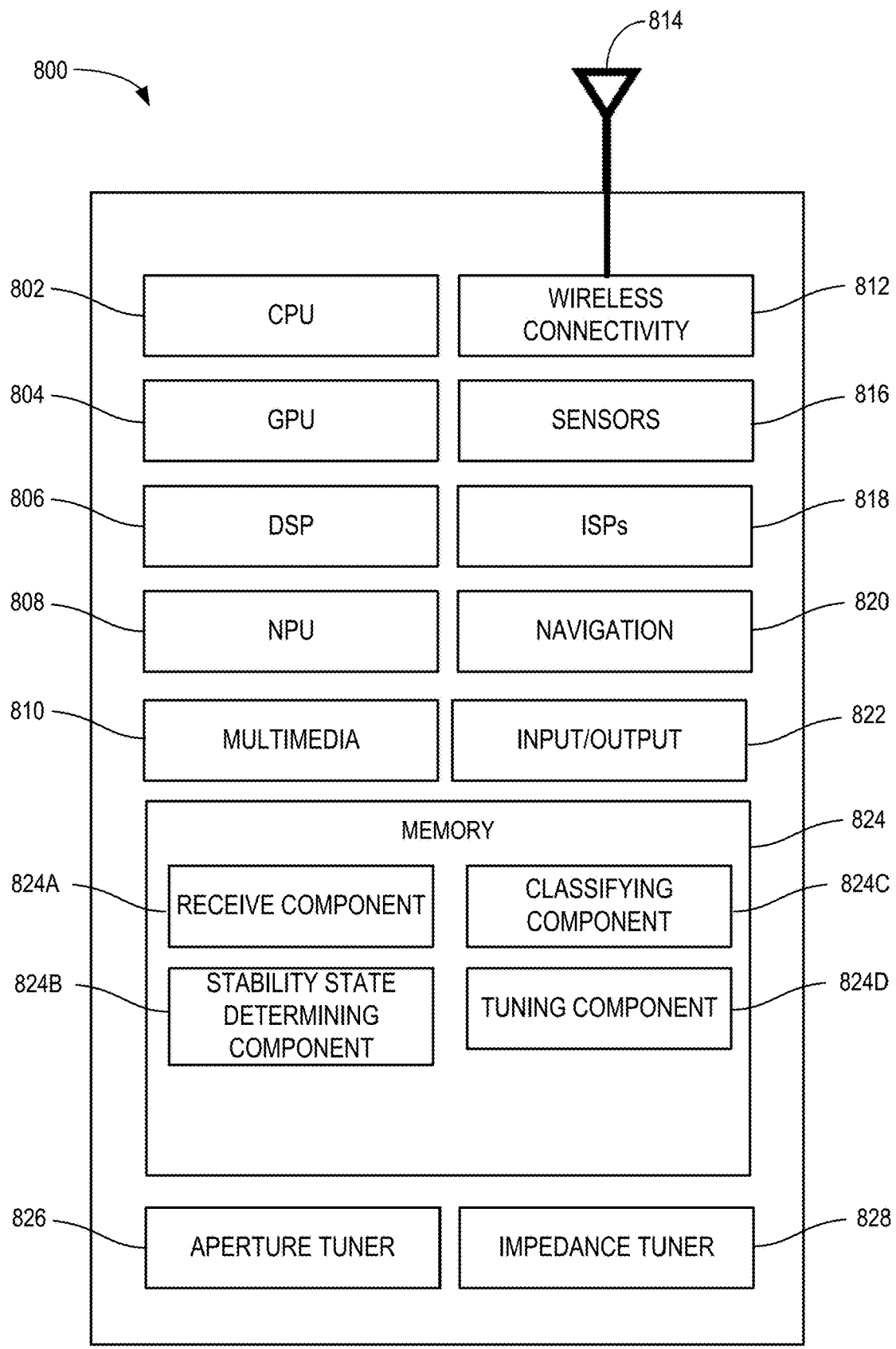
FIG. 8 illustrates an example electronic device that may be configured to perform antenna tuning while avoiding an antenna tuning configuration ping-pong scenario, as described herein.

FIG. 8 depicts an example processing system 800 for tuning antennas of a mobile device based on current and historical impedance measurements, such as described herein for example with respect to FIGS. 4-7.

Processing system 800 includes a central processing unit (CPU) 802, which in some examples may be a multi-core CPU. Instructions executed at the CPU 802 may be loaded, for example, from a program memory associated with the CPU 802 or may be loaded from memory 824.

Processing system 800 also includes additional processing components tailored to specific functions, such as a graphics processing unit (GPU) 804, a digital signal processor (DSP) 806, a neural processing unit (NPU) 808, a multimedia processing unit 810, and a wireless connectivity component 812.

An NPU, such as NPU 808, is generally a specialized circuit configured for implementing all the necessary control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing unit (TPU), neural network processor (NNP), intelligence processing unit (IPU), vision processing unit (VPU), or graph processing unit.

NPUs, such as NPU 808, are configured to accelerate the performance of common machine learning tasks, such as image classification, machine translation, object detection, and various other predictive models. In some examples, a plurality of NPUs may be instantiated on a single chip, such as a system on a chip (SoC), while in other examples the NPUs may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process it through an already trained model to generate a model output (e.g., an inference).

In one implementation, NPU 808 is a part of one or more of CPU 802, GPU 804, and/or DSP 806. In one implementation, CPU 802, GPU 804, DSP 806, and/or NPU 808 may be implemented as an SoC.

In some examples, wireless connectivity component 812 may include subcomponents, for example, for third generation (3G) connectivity, fourth generation (4G) connectivity (e.g., 4G LTE), fifth generation connectivity (e.g., 5G or NR), Wi-Fi connectivity, Bluetooth connectivity, and other wireless data transmission standards. Wireless connectivity component 812 is further connected to one or more antennas 814.

Processing system 800 may also include one or more sensor processing units 816 associated with any manner of sensor, one or more image signal processors (ISPs) 818 associated with any manner of image sensor, and/or a navigation processor 820, which may include satellite-based positioning system components (e.g., GPS or GLONASS) as well as inertial positioning system components.

Processing system 800 may also include one or more input and/or output devices 822, such as screens, touch-sensitive surfaces (including touch-sensitive displays), physical buttons, speakers, microphones, and the like.

In some examples, one or more of the processors of processing system 800 may be based on an ARM or RISC-V instruction set.

Processing system 800 also includes memory 824, which is representative of one or more static and/or dynamic memories, such as a dynamic random access memory, a flash-based static memory, and the like. In this example, memory 824 includes computer-executable components, which may be executed by one or more of the aforementioned processors of processing system 800.

In particular, in this example, memory 824 includes receive component 824A, stability state determining component 824B, classifying component 824C, and tuning component 824D. The depicted components, and others not depicted, may be configured to perform various aspects of the methods described herein.

Processing system 800 further comprises aperture tuner 826, such as described above, for example, with respect to the aperture tuner 334 of FIG. 3.

Processing system 800 further comprises impedance tuner 828, such as described above with respect to the impedance tuner 332 of FIG. 3.

Generally, processing system 800 and/or components thereof may be configured to perform the methods described herein.

Notably, in other cases, aspects of processing system 800 may be omitted. For example, multimedia processing unit 810, ISPs 818, and/or navigation processor 820 may be omitted in other aspects. Further, aspects of processing system 800 maybe distributed between multiple devices.

Example Aspects

Example aspects are set out in the following numbered clauses:

Clause 1: A method for wireless communications, comprising: receiving a measured impedance value corresponding to a current user interaction state with respect to one or more antennas of a mobile device; determining a user interaction stability state of the mobile device based on the measured impedance value and a set of historical impedance values; classifying the current user interaction state based at least on the measured impedance value and a plurality of impedance values from the set of historical impedance values; and tuning the one or more antennas based on the classified current user interaction state and the determined user interaction stability state of the mobile device.

Clause 2: The method of Clause 1, wherein determining the user interaction stability state of the mobile device comprises determining that the mobile device has reached a steady state different from a state associated with a last stable measured impedance value including: detecting that a change in impedance between consecutive measurements in the set of historical impedance values exceeds a threshold value; subsequent to detecting that the change exceeds the threshold value, detecting a convergence on a value from the set of historical impedance values and the measured impedance value; and based on detecting the convergence on the value, determining that the mobile device has reached the steady state different from the state associated with the last stable measured impedance value.

Clause 3: The method of Clause 2, wherein tuning the one or more antennas comprises tuning the one or more antennas to an antenna tuner configuration associated with the classified current user interaction state based on determining that the mobile device has reached the steady state different from the state associated with the last stable measured impedance value.

Clause 4: The method of Clause 3, wherein the antenna tuner configuration associated with the classified current user interaction state comprises an antenna aperture configuration associated with the classified current user interaction state.

Clause 5: The method of any of Clauses 3 or 4, wherein the antenna tuner configuration associated with the classified current user interaction state comprises an impedance tuning configuration associated with the classified current user interaction state.

Clause 6: The method of any of Clauses 2 through 5, wherein the threshold value is based on an amount of variability between the plurality of impedance values in the set of historical impedance values.

Clause 7: The method of Clause 1, wherein determining the user interaction stability state of the mobile device comprises determining that the mobile device has reached a steady state different from a state associated with a last stable measured impedance value including: determining a moving average of impedance values in the set of historical impedance values; based on determining that the measured impedance is more than a threshold amount away from the determined moving average, determining that the current user interaction state is different from a previous user interaction state; and subsequent to determining that the current user interaction state is different from the previous user interaction state, determining that the measured impedance value and one or more previously measured historical impedance values have converged.

Clause 8: The method of Clause 7, wherein tuning the one or more antennas comprises tuning the one or more antennas to an antenna tuner configuration associated with the classified current user interaction state based on determining that the mobile device has reached a steady state different from a state associated with the last stable measured impedance value.

Clause 9: The method of any of Clauses 1 through 8, wherein determining the user interaction stability state of the mobile device comprises determining that the mobile device has reached a steady state different from a state associated with a last stable measured impedance value, including identifying a match between the classified current user interaction state and classifications for each of a plurality of user interaction states associated with prior impedance values in the set of historical impedance values measured within a time window prior to the measured impedance value corresponding to the current user interaction state.

Clause 10: The method of any of Clauses 1 through 9, further comprising: classifying one or more prior user interaction states associated with impedance values measured within a threshold amount of time prior to the measured impedance value corresponding to the current user interaction state; determining that a classification of the current user interaction state and a classification of the one or more prior user interaction states are different; and identifying a user interaction state from the current user interaction state and the one or more prior user interaction states, the identified user interaction state being associated with a quality metric having a better value from a set of quality metrics associated with the current user interaction state and the one or more prior user interaction states, wherein tuning the one or more antennas comprises tuning the antennas to an antenna tuner configuration associated with the identified user interaction state.

Clause 11: The method of Clause 10, wherein the quality metric comprises one or more of an impedance value or an antenna efficiency metric.

Clause 12: The method of any of Clauses 1 through 11, wherein classifying the current user interaction state comprises classifying the current user interaction state using a machine learning model trained to classify at least the measured impedance value and the plurality of impedance values from the set of historical impedance values into one of a plurality of user interaction states.

Clause 13: An apparatus for wireless communications, comprising: one or more antennas; a memory having executable instructions stored thereon; and a processor configured to execute the executable instructions to cause the apparatus to: receive a measured impedance value corresponding to a current user interaction state with respect to the one or more antennas of the apparatus; determine a user interaction stability state of the apparatus based on the measured impedance value and a set of historical impedance values; classify the current user interaction state based at least on the measured impedance value and a plurality of impedance values from the set of historical impedance values; and tune the one or more antennas based on the classified current user interaction state and the determined user interaction stability state of the apparatus.

Clause 14: The apparatus of Clause 13, wherein in order to determine the user interaction stability state of the apparatus, the processor is configured to determine that the apparatus has reached a steady state different from a state associated with a last stable measured impedance value, and to determine that the apparatus has reached the steady state different from the state associated with the last stable measured impedance value, the processor is configured to: detect that a change in impedance between consecutive measurements in the set of historical impedance values exceeds a threshold value; subsequent to detecting that the change exceeds the threshold value, detect a convergence on a value from the set of historical impedance values and the measured impedance value; and determine, based on detecting the convergence on the value, that the apparatus has reached the steady state different from the state associated with the last stable measured impedance value.

Clause 15: The apparatus of Clause 14, wherein in order to tune the one or more antennas, the processor is configured to tune the one or more antennas to an antenna tuner configuration associated with the classified current user interaction state based on a determination that the apparatus has reached the steady state different from the state associated with the last stable measured impedance value.

Clause 16: The apparatus of Clause 15, wherein the antenna tuner configuration associated with the classified current user interaction state comprises an antenna aperture configuration associated with the classified current user interaction state.

Clause 17: The apparatus of any of Clauses 15 or 16, wherein the antenna tuner configuration associated with the classified current user interaction state comprises an impedance tuning configuration associated with the classified current user interaction state.

Clause 18: The apparatus of any of Clauses 14 through 17, wherein the threshold value is based on an amount of variability between the plurality of impedance values in the set of historical impedance values.

Clause 19: The apparatus of any of Clauses 13 through 18, wherein in order to determine the user interaction stability state of the apparatus, the processor is configured to determine that the apparatus has reached a steady state different from a state associated with a last stable measured impedance value, and to determine that the apparatus has reached the steady state different from the state associated with the last stable measured impedance value, the processor is configured to: determine a moving average of impedance values in the set of historical impedance values; based on determining that the measured impedance value is more than a threshold amount away from the determined moving average, determine that the current user interaction state is different from a previous user interaction state; and subsequent to determining that the current user interaction state is different from the previous user interaction state, determine that the measured impedance value and one or more previously measured historical impedance values have converged.

Clause 20: The apparatus of Clause 19, wherein in order to tune the one or more antennas, the processor is configured to tune the one or more antennas to an antenna tuner configuration associated with the classified current user interaction state based on determining that the apparatus has reached a steady state different from a state associated with the last stable measured impedance value.

Clause 21: The apparatus of any of Clauses 13 through 20, wherein in order to determine the user interaction stability state of the apparatus, the processor is configured to determine that the apparatus has reached a steady state different from a state associated with a last stable measured impedance value, and to determine that the apparatus has reached the steady state different from the state associated with the last stable measured impedance value, the processor is configured to identify a match between the classified current user interaction state and classifications for each of a plurality of user interaction states associated with prior impedance values in the set of historical impedance values measured within a time window prior to the measured impedance value corresponding to the current user interaction state.

Clause 22: The apparatus of any of Clauses 13 through 21, wherein the processor is further configured to: classify one or more prior user interaction states associated with impedance values measured within a threshold amount of time prior to the measured impedance value corresponding to the current user interaction state; determine that a classification of the current user interaction state and a classification of the one or more prior user interaction states are different; and identify a user interaction state from the current user interaction state and the one or more prior user interaction states, the identified user interaction state being associated with a quality metric having a better value from a set of quality metrics associated with the current user interaction state and the one or more prior user interaction states, wherein tuning the one or more antennas comprises tuning the antennas to an antenna tuner configuration associated with the identified user interaction state.

Clause 23: The apparatus of Clause 22, wherein the quality metric comprises one or more of an impedance value or an antenna efficiency metric.

Clause 24: The apparatus of any of Clauses 13 hrough 23, wherein in order to classify the current user interaction state, the processor is configured to classify the current user interaction state using a machine learning model trained to classify at least the measured impedance value and the plurality of impedance values from the set of historical impedance values into one of a plurality of user interaction states.

Clause 25: A processing system, comprising: a wireless data transmission system; a memory comprising computer-executable instructions; and one or more processors configured to execute the computer-executable instructions and cause the processing system to perform a method in accordance with any of Clauses 1-12.

Clause 26: A processing system, comprising means for performing a method in accordance with any of Clauses 1 through 12.

Clause 27: A non-transitory computer-readable medium comprising computer-executable instructions that, when executed by one or more processors of a processing system, cause the processing system to perform a method in accordance with any of Clauses 1 through 12.

Clause 28: A computer program product embodied on a computer-readable storage medium comprising code for performing a method in accordance with any of Clauses 1 through 12.

Clause 29: A system-on-a-chip (SoC) configured to perform a method in accordance with any of Clauses 1 through 12.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for wireless communications, comprising:
   receiving a measured impedance value corresponding to a current user interaction state with respect to one or more antennas of a mobile device;
   determining a user interaction stability state of the mobile device based on the measured impedance value and a set of historical impedance values;
   classifying the current user interaction state based at least on the measured impedance value and a plurality of impedance values from the set of historical impedance values; and
   tuning the one or more antennas based on the classified current user interaction state and the determined user interaction stability state of the mobile device, wherein determining the user interaction stability state of the mobile device comprises determining that the mobile device has reached a steady state different from a state associated with a last stable measured impedance value including:
   detecting that a change in impedance between consecutive measurements in the set of historical impedance values exceeds a threshold value;
   subsequent to detecting that the change exceeds the threshold value, detecting a convergence on a value from the set of historical impedance values and the measured impedance value; and
   based on detecting the convergence on the value, determining that the mobile device has reached the steady state different from the state associated with the last stable measured impedance value.

2. The method of claim 1, wherein tuning the one or more antennas comprises tuning the one or more antennas to an antenna tuner configuration associated with the classified current user interaction state based on determining that the mobile device has reached the steady state different from the state associated with the last stable measured impedance value.

3. The method of claim 2, wherein the antenna tuner configuration associated with the classified current user interaction state comprises an antenna aperture configuration associated with the classified current user interaction state.

4. The method of claim 2, wherein the antenna tuner configuration associated with the classified current user interaction state comprises an impedance tuning configuration associated with the classified current user interaction state.

5. The method of claim 1, wherein the threshold value is based on an amount of variability between the plurality of impedance values in the set of historical impedance values.

6. The method of claim 1, wherein determining the user interaction stability state of the mobile device further comprises identifying a match between the classified current user interaction state and classifications for each of a plurality of user interaction states associated with prior impedance values in the set of historical impedance values measured within a time window prior to the measured impedance value corresponding to the current user interaction state.

7. The method of claim 1, further comprising:
   classifying one or more prior user interaction states associated with impedance values measured within a threshold amount of time prior to the measured impedance value corresponding to the current user interaction state;
   determining that a classification of the current user interaction state and a classification of the one or more prior user interaction states are different; and
   identifying a user interaction state from the current user interaction state and the one or more prior user interaction states, the identified user interaction state being associated with a quality metric having a better value from a set of quality metrics associated with the current user interaction state and the one or more prior user interaction states, wherein tuning the one or more antennas comprises tuning the antennas to an antenna tuner configuration associated with the identified user interaction state.

8. The method of claim 7, wherein the quality metric comprises one or more of an impedance value or an antenna efficiency metric.

9. The method of claim 1, wherein classifying the current user interaction state comprises classifying the current user interaction state using a machine learning model trained to classify at least the measured impedance value and the plurality of impedance values from the set of historical impedance values into one of a plurality of user interaction states.

10. A method for wireless communications, comprising:
receiving a measured impedance value corresponding to a current user interaction state with respect to one or more antennas of a mobile device;
determining a user interaction stability state of the mobile device based on the measured impedance value and a set of historical impedance values;
classifying the current user interaction state based at least on the measured impedance value and a plurality of impedance values from the set of historical impedance values; and
tuning the one or more antennas based on the classified current user interaction state and the determined user interaction stability state of the mobile device, wherein determining the user interaction stability state of the mobile device comprises determining that the mobile device has reached a steady state different from a state associated with a last stable measured impedance value including:
determining a moving average of impedance values in the set of historical impedance values;
based on determining that the measured impedance value is more than a threshold amount away from the determined moving average, determining that the current user interaction state is different from a previous user interaction state; and
subsequent to determining that the current user interaction state is different from the previous user interaction state, determining that the measured impedance value and one or more previously measured historical impedance values have converged.

11. The method of claim 10, wherein tuning the one or more antennas comprises tuning the one or more antennas to an antenna tuner configuration associated with the classified current user interaction state based on determining that the mobile device has reached a steady state different from a state associated with the last stable measured impedance value.

12. An apparatus for wireless communications, comprising:
one or more antennas;
a memory having executable instructions stored thereon; and
one or more processors configured to execute the executable instructions to cause the apparatus to:
receive a measured impedance value corresponding to a current user interaction state with respect to the one or more antennas of the apparatus;
determine a user interaction stability state of the apparatus based on the measured impedance value and a set of historical impedance values;
classify the current user interaction state based at least on the measured impedance value and a plurality of impedance values from the set of historical impedance values; and
tune the one or more antennas based on the classified current user interaction state and the determined user interaction stability state of the apparatus, wherein in order to determine the user interaction stability state of the apparatus, the one or more processors are configured to determine that the apparatus has reached a steady state different from a state associated with a last stable measured impedance value, and to determine that the apparatus has reached the steady state different from the state associated with the last stable measured impedance value, the one or more processors are configured to:
detect that a change in impedance between consecutive measurements in the set of historical impedance values exceeds a threshold value;
subsequent to detecting that the change exceeds the threshold value, detect a convergence on a value from the set of historical impedance values and the measured impedance value; and
determine, based on detecting the convergence on the value, that the apparatus has reached the steady state different from the state associated with the last stable measured impedance value.

13. The apparatus of claim 12, wherein in order to tune the one or more antennas, the one or more processors are configured to tune the one or more antennas to an antenna tuner configuration associated with the classified current user interaction state based on a determination that the apparatus has reached the steady state different from the state associated with the last stable measured impedance value.

14. The apparatus of claim 13, wherein the antenna tuner configuration associated with the classified current user interaction state comprises an antenna aperture configuration associated with the classified current user interaction state.

15. The apparatus of claim 13, wherein the antenna tuner configuration associated with the classified current user interaction state comprises an impedance tuning configuration associated with the classified current user interaction state.

16. The apparatus of claim 12, wherein the threshold value is based on an amount of variability between the plurality of impedance values in the set of historical impedance values.

17. The apparatus of claim 12, wherein in order to determine the user interaction stability state of the apparatus, the one or more processors are further configured to identify a match between the classified current user interaction state and classifications for each of a plurality of user interaction states associated with prior impedance values in the set of historical impedance values measured within a time window prior to the measured impedance value corresponding to the current user interaction state.

18. The apparatus of claim 12, wherein the one or more processors are further configured to:
classify one or more prior user interaction states associated with impedance values measured within a threshold amount of time prior to the measured impedance value corresponding to the current user interaction state;
determine that a classification of the current user interaction state and a classification of the one or more prior user interaction states are different; and
identify a user interaction state from the current user interaction state and the one or more prior user interaction states, the identified user interaction state being associated with a quality metric having a better value from a set of quality metrics associated with the current user interaction state and the one or more prior user interaction states, wherein tuning the one or more antennas comprises tuning the antennas to an antenna tuner configuration associated with the identified user interaction state.

19. The apparatus of claim 18, wherein the quality metric comprises one or more of an impedance value or an antenna efficiency metric.

20. The apparatus of claim 12, wherein in order to classify the current user interaction state, the one or more processors are configured to classify the current user interaction state using a machine learning model trained to classify at least the measured impedance value and the plurality of impedance values from the set of historical impedance values into one of a plurality of user interaction states.

21. An apparatus for wireless communications, comprising:
    one or more antennas;
    a memory having executable instructions stored thereon; and
    one or more processors configured to execute the executable instructions to cause the apparatus to:
        receive a measured impedance value corresponding to a current user interaction state with respect to the one or more antennas of the apparatus;
        determine a user interaction stability state of the apparatus based on the measured impedance value and a set of historical impedance values;
        classify the current user interaction state based at least on the measured impedance value and a plurality of impedance values from the set of historical impedance values; and
        tune the one or more antennas based on the classified current user interaction state and the determined user interaction stability state of the apparatus, wherein in order to determine the user interaction stability state of the apparatus, the one or more processors are configured to determine that the apparatus has reached a steady state different from a state associated with a last stable measured impedance value, and to determine that the apparatus has reached the steady state different from the state associated with the last stable measured impedance value, the one or more processors are configured to:
        determine a moving average of impedance values in the set of historical impedance values;
        based on determining that the measured impedance value is more than a threshold amount away from the determined moving average, determine that the current user interaction state is different from a previous user interaction state; and
        subsequent to determining that the current user interaction state is different from the previous user interaction state, determine that the measured impedance value and one or more previously measured historical impedance values have converged.

22. The apparatus of claim 21, wherein in order to tune the one or more antennas, the one or more processors are configured to tune the one or more antennas to an antenna tuner configuration associated with the classified current user interaction state based on determining that the apparatus has reached a steady state different from a state associated with the last stable measured impedance value.

23. An apparatus for wireless communications, comprising:
    means for receiving a measured impedance value corresponding to a current user interaction state with respect to one or more antennas of the apparatus;
    means for determining a user interaction stability state of the apparatus based on the measured impedance value and a set of historical impedance values;
    means for classifying the current user interaction state based at least on the measured impedance value and a plurality of impedance values from the set of historical impedance values; and
    means for tuning the one or more antennas based on the classified current user interaction state and the determined user interaction stability state of the apparatus, wherein the means for determining the user interaction stability state of the apparatus comprises means for determining that the apparatus has reached a steady state different from a state associated with a last stable measured impedance value including:
    means for detecting that a change in impedance between consecutive measurements in the set of historical impedance values exceeds a threshold value;
    means for detecting, subsequent to detecting that the change exceeds the threshold value, a convergence on a value from the set of historical impedance values and the measured impedance value; and
    means for determining, based on detecting the convergence on the value, that the apparatus has reached the steady state different from the state associated with the last stable measured impedance value.

24. The apparatus of claim 23, further comprising:
    means for classifying one or more prior user interaction states associated with impedance values measured within a threshold amount of time prior to the measured impedance value corresponding to the current user interaction state;
    means for determining that a classification of the current user interaction state and a classification of the one or more prior user interaction states are different; and
    means for identifying a user interaction state from the current user interaction state and the one or more prior user interaction states, the identified user interaction state being associated with a quality metric having a better value from a set of quality metrics associated with the current user interaction state and the one or more prior user interaction states, wherein the means for tuning the one or more antennas comprises means for tuning the antennas to an antenna tuner configuration associated with the identified user interaction state.

* * * * *